SEMICONDUCTOR DEVICES AND METHOD OF MAKING THEM

Filed June 28, 1954

INVENTOR.
WILLIAM M. WEBSTER, JR.
BY J. L. Whittaker
ATTORNEY

United States Patent Office 2,849,342

Patented Aug. 26, 1958

2,849,342

SEMICONDUCTOR DEVICES AND METHOD OF MAKING THEM

William M. Webster, Jr., Princeton, N. J., assignor to Radio Corporation of America, a corporation of Delaware Application June 28, 1954, Serial No. 439,582

13 Claims. (Cl. 148—1.5)

Figure 1:
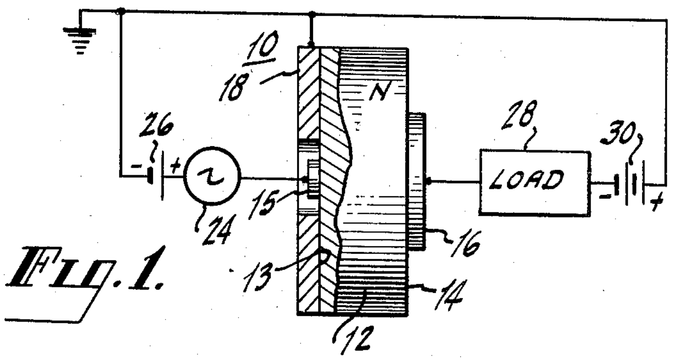

This invention relates to semiconductor devices such as transistors and particularly to improved transistors suitable for high frequency operation and to improved methods of fabricating them.

One type of transistor to which the principles of the invention apply comprises a body of semiconductor material having two rectifying electrodes in contact therewith. The rectifying electrodes may be surface barrier electrodes of comparatively large area for example, plates or films in rectifying contact with the surface of the crystal or they may be P–N junction electrodes. In such a transistor, one rectifying electrode is operated as an input or emitter electrode and injects minority charge carriers into the crystal. The minority charge carriers are collected by the other rectifying electrode which is termed the output or collector electrode. A base electrode is in ohmic (non-rectifying) contact with the crystal, which is the base region of the device. The electrical potential of the crystal or base region, with respect to the rectifying electrodes, controls the emitter-to-collector current flow.

There are several factors which limit the high frequency operation of a transistor. One of these is a resistive parameter called base lead resistance which is present in circuit between the base region and the base electrode of a transistor.

Another limiting parameter is emitter-input-capacitance which is primarily due to the mode of transmission of the minority carriers through the base region by a process of diffusion. Thus, in effect, this capacitance is a diffusion capacitance and is proportional to the emitter current and to the square of the thickness of the base region between the emitter and collector electrodes. In the transistor, the base-lead-resistance in series with the emitter-input-capacitance forms a voltage divider which reduces the effective input signal at high frequencies. This action adversely affects the operation of a transistor at high frequencies.

Another factor affecting transistor operation is the magnitude of the collector junction capacitance or collector-to-base capacitance. When a reverse voltage is applied across the collector junction or barrier, a region of exhaustion of majority carriers is formed and this effect gives rise to the collector junction capacitance. The region of exhaustion of majority carriers is termed a space-charge layer or a depletion layer and, in effect, represents a thickening of the junction. The magnitude of the collector junction capacitance is inversely proportional to the thickness of the junction, so that as the depletion layer is widened and, in effect, the junction is thickened, the collector junction capacitance is reduced.

It has previously been found that high frequency operation of transistors can be improved by reducing the magnitude of any or all of the base lead resistance, the emitter input capacitance and the collector junction capacitance. A previously known method of reducing the emitter capacitance factor comprises applying a force on the charge carriers in the base region, in the form of an electric or magnetic field, to control their flow between the emitter and collector electrodes.

A previously known method of reducing the base lead resistance comprises employing higher conductivity material for the base region. However, if higher conductivity material is employed, collector junction breakdown voltage is lowered and collector junction capacitance is increased. This occurs because the higher conductivity material of the base region reduces the width of the space charge region at the collector junction or barrier across which the applied collector voltage appears.

One solution of the problem of reducing base lead resistance without unduly lowering collector breakdown voltage comprises employing a non-uniform distribution of impurities in the base region. The impurity distribution is such that the portion of the base region adjacent to the emitter electrode is of relatively low resistivity material and the portion of the base region adjacent to the collector electrode is of relatively higher resistivity material. Such construction provides reduced base resistance, reduced emitter capacitance, increased collector breakdown voltage, lowered collector-to-base capacitance and generally improved high frequency response.

An important object of this invention is to provide semi-conductor devices of new and improved form and improved methods of making the same.

Another object of the invention is to provide an improved semiconductor device suitable for operation at high frequencies.

A further object of the invention is to provide an improved semiconductor device having reduced base lead resistance, reduced collector junction capacitance, reduced emitter input capacitance and comparatively high collector breakdown voltage.

Another object is to provide an improved high frequency transistor or the like having a base region the conductivity of which varies continuously and essentially exponentially between different surfaces thereof.

In general, the purposes and objects of this invention are accomplished in an improved transistor having a base region having a non-uniform conductivity distribution throughout its thickness according to an essentially exponential gradient with the highest conductivity portion thereof adjacent to the emitter electrode and the lowest conductivity portion thereof adjacent to the collector electrode. The base electrode lead is connected to the highest conductivity material adjacent to the emitter electrode. Such an exponential conductivity gradient thus provides optimum reduction of injut and output capacitance and base resistance, with improved input and output impedance relations, as well as increased collector breakdown voltage.

Figure 2:
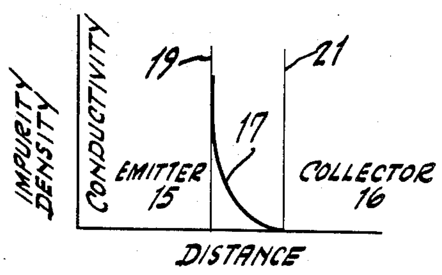

The invention is described in greater detail by reference to the drawing wherein:

Fig. 1 is an elevational view partly in section of a semiconductor device embodying the principles of the invention; and, Fig. 2 is a schematic representation of portions of the device of Figure 1 showing certain of the chemical and electrophysical characteristics thereof.

Similar reference characters are applied to similar elements throughout the drawing.

Referring to Figure 1, a typical semiconductor device 10, according to the invention, includes a crystal or body 12 of semi-conductor material, for example, germanium or silicon of N-type or P-type conductivity. For the purposes of the present invention, the crystal 12 is assumed to be N-type germanium. The body 12 may be in any suitable form, for example, it may be in the form of a circular disk, as shown, having a pair of substantially parallel, plane surfaces 13 and 14. The device 10 also includes an emitter rectifying electrode 15 and a collector rectifying electrode 16 in contact with the crystal 12, as described hereinafter.

According to the invention, the body or base region 12 is uniformly of N-type conductivity material. However, the magnitude of the conductivity is non-uniformly distributed along an essentially exponential gradient between the surfaces 13 and 14 with the portion of highest conductivity positioned adjacent to the emitter electrode 15 and the portion of lowest conductivity positioned adjacent to the collector electrode 16. The substantially exponential conductivity gradient results from a similar exponential donor impurity distribution in the base region. Referring to Figure 2, the curve 17 represents the impurity distribution and conductivity distribution in the crystal 12 between the adjacent edges of the emitter and collector electrodes represented by the lines 19 and 21, respectively. The curve 17 represents the variation in impurity density and conductivity in the N-type base region from comparatively high values adjacent to the emitter electrode and decreasing substantially exponentially to approximately zero adjacent to the collector electrode. Curve 17 is therefore an exponential curve, that is, a curve defined by the equation $y=ab^x$, where $a$ and $b$ are constants and $x$ is the independent variable; $x$ in this case represents the distance in the base region 12 proceeding from surface 13, adjacent the emitter 15, toward surface 14 adjacent the collector 16; and $y$ represents the impurity density or conductivity of the base region.

A base electrode 18, preferably in the form of a metal ring, is connected in ohmic (non-rectifying) contact to the base region 12 in the vicinity of the highest conductivity material and surrounding the emitter electrode 15.

The device 10 thus includes adjacent to the emitter electrode 15 an effective base region of low resistance which, in effect provides the device with comparatively low base lead resistance. The device also includes an effective base region of high resistance adjacent to the collector electrode 16 and forming a portion of the collector barrier region. Thus, the space charge region at the collector junction has sufficient width to provide a comparatively high collector breakdown voltage. Furthermore, the penetration of space charge associated with the collector barrier into the base 12 provides an additional electric field within this region which also serves to accelerate the flow of minority charge carriers from the emitter to the collector and thus to reduce charge transit time and to improve high frequency response. In addition, the exponential distribution of donor impurities in the base region provides an electric field therein which accelerates the flow of minority charge carriers from the emitter to the collector.

In operation of the device 10 as an amplifier, the emitter electrode 15 is biased in the forward direction with respect to the crystal or base region 12 by a connection through a signal source 24 to the positive terminal of a bias battery 26, the negative terminal of which is connected to the base electrode 18 and to a source of reference potential such as ground. The collector electrode 16 is biased in the reverse direction with respect to the crystal by a connection through a load circuit 28 to the negative terminal of a battery 30, the positive terminal of which is connected to the base electrode and to ground.

The device 10 may be prepared according to the following method. A body of substantially intrinsic germanium of high resistivity to comprise the base region 12, is prepared according to conventional crystal growing techniques. Such a body has comparatively high resistivity of the order of 10–50 ohm-centimeters. The body is also preferably in the form of a disk or plate having a thickness of the order of one mil or preferably a fraction of one mil.

Next, impurity atoms are appropriately diffused into the body of germanium to achieve the desired exponential distribution of impurities. The desired impurity distribution may be achieved by proper control of the source function, that is, the rate of absorption of impurity atoms into the surface of the crystal. The desired impurity atoms may be obtained as follows: (1) from a gas of impurity atoms the vapor pressure of which at the surface of the crystal is controlled; (2) by vaporization of impurity material at a controlled rate onto the surface of the crystal; (3) by bombardment of the surface with impurity atoms at a controlled rate; and (4) by diffusion of impurity atoms through another medium whose temperature is controlled.

For the purposes of the present invention, the preferred method of providing a source of impurity atoms at the crystal surface is the third, that is, by bombardment of the surface of the crystal with impurity atoms at a controlled rate. The desired impurity atoms may be obtained in any suitable manner, for example, from an ion gun of the type used in a mass spectrometer. In order to obtain a crystal of N-type conductivity, bombardment may be effected with the atoms of any one of antimony, bismuth, or arsenic. To obtain a crystal of P-type conductivity, atoms of any one of indium, aluminum, or gallium may be employed.

According to such method, one entire surface of the selected base crystal is bombarded by a supply of the selected impurity atoms. Then, the desired exponential distribution in the crystal may be achieved in two ways. First, if the source function is held constant, i. e. if a constant number of impurity atoms per second are absorbed by the surface of the crystal, the temperature of the crystal is varied so that the diffusion constant of the impurity atoms, D, varies inversely with time, $t$. This may be accomplished if the temperature T decreases logarithmically with time i. e.

$$T\alpha\frac{1}{\log^{t}}$$

The temperature range for this operation depends, among other things, on the type of semiconductor material employed and its diffusion coefficient. A germanium crystal is first heated to a temperature of the order of 800° C. While the surface 13 of the crystal is bombarded with a constant number of ions from the ion gun, its temperature is decreased logarithmically with time to about 700° C.

According to the second method of obtaining the desired exponential impurity distribution, the crystal of of germanium is maintained at a constant temperature in the range of 700° C., to 900° C. and the source function is varied exponentially with time, $t$, preferably from a minimum value to a maximum value. The foregoing methods may be appropriately varied to achieve substantially any desired conductivity variation, for example hyperbolic, in a semiconductor crystal. A hyperbolic curve is one having the general equation $x^a y^b = c^{a+b}$ where $a$ and $b$ are positive integers, and $x$ and $y$ are as previously defined.

After the crystal has thus been provided with an exponential impurity distribution and, as a result, an exponential conductivity distribution, the emitter and collector electrodes 14 and 16, respectively, are formed in rectifying contact therewith.

The rectifying electrodes 14 and 16 may be formed by an alloying or fusion process described in an article by Law, Mueller, and Pankove entitled "A developmental germanium P–N–P junction transistor," appearing on pages 1352–1357 of the Proceedings of the IRE of November 1952. According to the method described in said article, P–N junction electrodes are produced by alloying or fusing quantities of a suitable donor or acceptor impurity material, in this instance an acceptor material such as indium into opposite surfaces of the crystal 12. The process is effected, preferably, to form the electrode rectifying barriers close to the surfaces of the crystal.

The electrodes 14 and 16 may also be prepared according to a method described and claimed in U. S. Patent 2,609,428 to H. B. Law whereby rectifying films or plates are formed on the surface of a semiconductor crystal by an evaporation process.

The theoretical considerations underlying the present invention are believed to be as follows. The type of conductivity and magnitude of conductivity of a body of semiconductor material are determined by the type and concentration of impurities within the body. The density of conduction charge carriers in a semiconductor body is determined by the impurity concentration. For example, an N-type semiconductor body of uniform conductivity contains a uniform distribution of conduction electrons and the body has no internal electric field. Thus, holes which pass through such a body travel by a process of diffusion.

However, if the conductivity of such a semiconductor body is non-uniform, the impurity distribution and electron density are similarly non-uniform. If the electron density is non-uniform, then the body has an internal electric field which aids the flow of minority charge carriers. It has been determined that a uniform electric field across the base region from the emitter side to the collector side provides the shortest transit time for minority charge carriers. Such a uniform electric field is obtained when the impurity concentration and conductivity of the semiconductor body follow an exponential distribution. The desired distribution is such that the highest conductivity portion of the base region is adjacent to the emitter and the lowest conductivity portion is adjacent to the collector.

What is claimed is:

1. A semiconductor device comprising a body of crystalline semiconductor material containing a conductivity-type impurity and a pair of rectifying electrodes in contact with said body, said body having at least a portion thereof between said electrodes, the impurity distribution and consequent conductivity distribution of which varies exponentially.

2. A semiconductor device comprising a body of crystalline semiconductor material of one type of conductivity, emitter and collector rectifying electrodes in contact with said body, the magnitude of conductivity of said body varying substantially exponentially between said electrodes with the highest conductivity portion adjacent to said emitter electrode and the lowest conductivity portion adjacent to said collector electrode.

3. A semiconductor device comprising a body of crystalline semiconductor material consisting of at least three layers of semiconductor materials including, in order, a first layer of one type of conductivity material, a second layer of opposite conductivity type material, said second layer having a conductivity distribution varying exponentially between said second and third layers, said third layer of material of the same type of conductivity as said first layer.

4. A semiconductor device comprising a body of crystalline semiconductor material having two regions of the same conductivity-type material, and a base region of opposite conductivity-type semiconductor material interposed between said two regions, said base region having an exponential conductivity distribution.

5. A semiconductor device comprising a body of crystalline semiconductor material having an emitter semiconductor region and a collector semiconductor region of the same conductivity type material, and a base region of opposite conductivity-type material interposed between said two regions and separated therefrom by rectifying barriers, said base region having an exponential distribution of conductivity.

6. A semiconductor device comprising a body of crystalline semiconductor material having an emitter semiconductor region and a collector semiconductor region of the same conductivity type material, and a base region of opposite conductivity-type material interposed between said two regions and separated therefrom by rectifying barriers, said base region having an exponential distribution of conductivity, the lowest conductivity portion being adjacent to said collector region and highest conductivity portion being adjacent to said emitter region.

7. The method of making a semiconductor device comprising the steps of preparing a body of crystalline semiconductor material of substantially intrinsic conductivity, providing a constant supply of impurity atoms at one surface of said body, varying the temperature of said body exponentially while maintaining the supply of impurity atoms constant whereby said body is provided with a characteristic type of conductivity with the magnitude of conductivity varying throughout said body exponentially, and providing a rectifying electrode in contact with said body.

8. The method of making a semiconductor device comprising the steps of preparing a body of crystalline semiconductor material of substantially intrinsic conductivity, maintaining the temperature of said body constant, providing a supply of impurity atoms at a surface of said body, varying the quantity of said atoms exponentially, introducing said varying quantity of atoms into said body through said surface whereby a characteristic type of conductivity is imparted to said body, the magnitude of said conductivity varying throughout said body exponentially and providing rectifying electrodes in contact with said body.

9. A semiconductor device comprising a body of crystalline semiconductor material containing a conductivity-type impurity and a pair of rectifying electrodes in contact with said body, said body having at least a portion thereof between said electrodes, the impurity distribution and consequent conductivity distribution of which varies hyperbolically.

10. A transistor device comprising a body of crystalline semiconductor material selected from the class consisting of germanium and silicon and having a pair of opposed surfaces, said body having a conductivity distribution such that the impurity concentration diminishes from one surface toward the opposed surface thereof according to an exponential distribution, a rectifying electrode surface alloyed to said one surface and another rectifying electrode surface alloyed to said opposed surface.

11. A semiconductor device comprising a body of crystalline semiconductor material, an emitter electrode in rectifying contact with said body, a collector electrode in rectifying contact with said body, the material of said body having a conductivity distribution such that the impurity concentration diminishes from said emitter electrode according to an exponential distribution, with higher conductivity material adjacent to said emitter electrode and lower conductivity material adjacent to said collector electrode, means for making electrical connections to said emitter electrode and to said collector electrode, and means for making electrical connection to said higher conductivity material of said semiconductor material adjacent said emitter electrode.

12. A semiconductor device according to claim 11 wherein said crystalline semiconductor material comprises germanium.

13. A semiconductor device comprising a body of crystalline semiconductor material, an emitter electrode in rectifying contact with said body, a collector electrode in rectifying contact with said body, the material of said body having a conductivity distribution such that the impurity concentration diminishes from said emitter electrode according to an exponential distribution, with higher conductivity material adjacent to said emitter electrode and lower conductivity material adjacent to said collector electrode, means for making electrical connections to said emitter electrode and to said collector electrode, and annular means surrounding said emitter electrode for making electrical connection to said higher conductivity material of said semiconductor material adjacent said emitter electrode.

(References on following page)

References Cited in the file of this patent

UNITED STATES PATENTS

| | | |
|---|---|---|
| 2,502,479 | Pearson | Apr. 4, 1950 |
| 2,560,594 | Pearson | July 17, 1951 |
| 2,569,347 | Shockley | Sept. 25, 1951 |
| 2,583,008 | Olsen | Jan. 22, 1952 |
| 2,589,658 | Bardeen et al. | Mar. 18, 1952 |
| 2,597,028 | Pfann | May 20, 1952 |
| 2,603,693 | Kircher | July 15, 1952 |
| 2,623,102 | Shockley | Dec. 23, 1952 |
| 2,691,736 | Haynes | Oct. 12, 1954 |
| 2,695,852 | Sparks | Nov. 30, 1954 |
| 2,744,970 | Shockley | May 8, 1956 |